US012595562B2

(12) United States Patent
Miura

(10) Patent No.: US 12,595,562 B2
(45) Date of Patent: Apr. 7, 2026

(54) HEAT TREATMENT APPARATUS

(71) Applicant: Tokyo Electron Limited, Tokyo (JP)

(72) Inventor: Yoshitaka Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 439 days.

(21) Appl. No.: 18/446,634

(22) Filed: Aug. 9, 2023

(65) Prior Publication Data

US 2024/0060184 A1     Feb. 22, 2024

(30) Foreign Application Priority Data

Aug. 19, 2022     (JP) ................................. 2022-131128

(51) Int. Cl.
| | | |
|---|---|---|
| *C23C 16/40* | (2006.01) | |
| *C23C 16/458* | (2006.01) | |
| *C23C 16/46* | (2006.01) | |
| *H01L 21/67* | (2006.01) | |

(52) U.S. Cl.
CPC .......... *C23C 16/46* (2013.01); *C23C 16/4583* (2013.01); *H01L 21/67109* (2013.01)

(58) Field of Classification Search
CPC ................ C23C 16/46; C23C 16/4583; C23C 16/45578; C23C 16/4584; C23C 16/54; C23C 16/45551; C23C 16/545; C23C 16/4412; C23C 14/568; C23C 16/4401; H01L 21/67109; H01L 21/683; H01L 21/67098; H01L 21/67103; H01L 21/67303; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745
USPC ................ 118/719, 715; 156/345.31, 345.32
See application file for complete search history.

(56) References Cited

U.S. PATENT DOCUMENTS

| | | | | |
|---|---|---|---|---|
| 4,524,719 A | * | 6/1985 | Campbell ............. | C23C 16/481 |
| | | | | 414/217 |
| 5,329,095 A | * | 7/1994 | Okase ............... | H01L 21/67103 |
| | | | | 118/724 |
| 6,444,940 B1 | * | 9/2002 | Saito ....................... | C23C 16/46 |
| | | | | 118/724 |

(Continued)

FOREIGN PATENT DOCUMENTS

WO        2018150537 A1    8/2018

*Primary Examiner* — Rudy Zervigon
(74) *Attorney, Agent, or Firm* — Armstrong Teasdale LLP

(57) ABSTRACT

A heat treatment apparatus includes: a processing container having a roof in a cylindrical shape and a lower end opening, and in which a first space is formed; a lid for closing the lower end opening; a support including a shaft portion and a placement portion; a boat installed on the placement portion to vertically hold substrates; a partitioning member provided around the shaft portion with a gap left from a lower surface of the placement portion to form a second space partitioned from the first space; and a heat insulating material provided in the second space. An exhaust port is provided in a sidewall of the processing container. In a circumferential direction of the processing container, the gap includes a first gap having at least an angular position where the exhaust port is provided, and a second gap provided at an angular position excluding the first gap.

13 Claims, 9 Drawing Sheets

(56)          References Cited

U.S. PATENT DOCUMENTS

| 11,219,096 | B2 * | 1/2022 | Saido | ................ | H01L 21/68792 |
| 2020/0187305 | A1 * | 6/2020 | Saido | .................. | C23C 16/4584 |

* cited by examiner

HEAT TREATMENT APPARATUS

CROSS-REFERENCE TO RELATED APPLICATION

This application is based upon and claims the benefit of priority from Japanese Patent Application No. 2022-131128, filed on Aug. 19, 2022, the entire contents of which are incorporated herein by reference.

TECHNICAL FIELD

The present disclosure relates to a heat treatment apparatus.

BACKGROUND

A substrate processing apparatus is known in which a boat for holding a plurality of substrates arranged in multiple stages is accommodated in a reaction container having an opening at a lower end thereof, and a heat treatment is performed on the plurality of substrates while the opening is closed with a lid part. In this substrate processing apparatus, a cover part for covering the lid part is provided, and a heat insulator is provided in a space covered by the cover part.

SUMMARY

According to one embodiment of the present disclosure, there is provided a heat treatment apparatus, including: a processing container having a roof in a cylindrical shape and a lower end opening, and in which a first space is formed; a lid configured to close the lower end opening; a support provided to pass through the lid and including a shaft portion and a placement portion located above the shaft portion; a boat installed on the placement portion and configured to hold a plurality of substrates arranged in multiple stages in a vertical direction; a partitioning member provided around the shaft portion with a gap left from a lower surface of the placement portion and configured to form a second space partitioned from the first space; and a heat insulating material provided in the second space, wherein an exhaust port is provided in a portion of a sidewall of the processing container, in a circumferential direction of the processing container, the gap includes a first gap having at least an angular position where the exhaust port is provided, and a second gap provided at an angular position excluding the first gap, and the first gap is wider than the second gap.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a perspective view of a partitioning member viewed obliquely from above.

DETAILED DESCRIPTION

Figure 1:
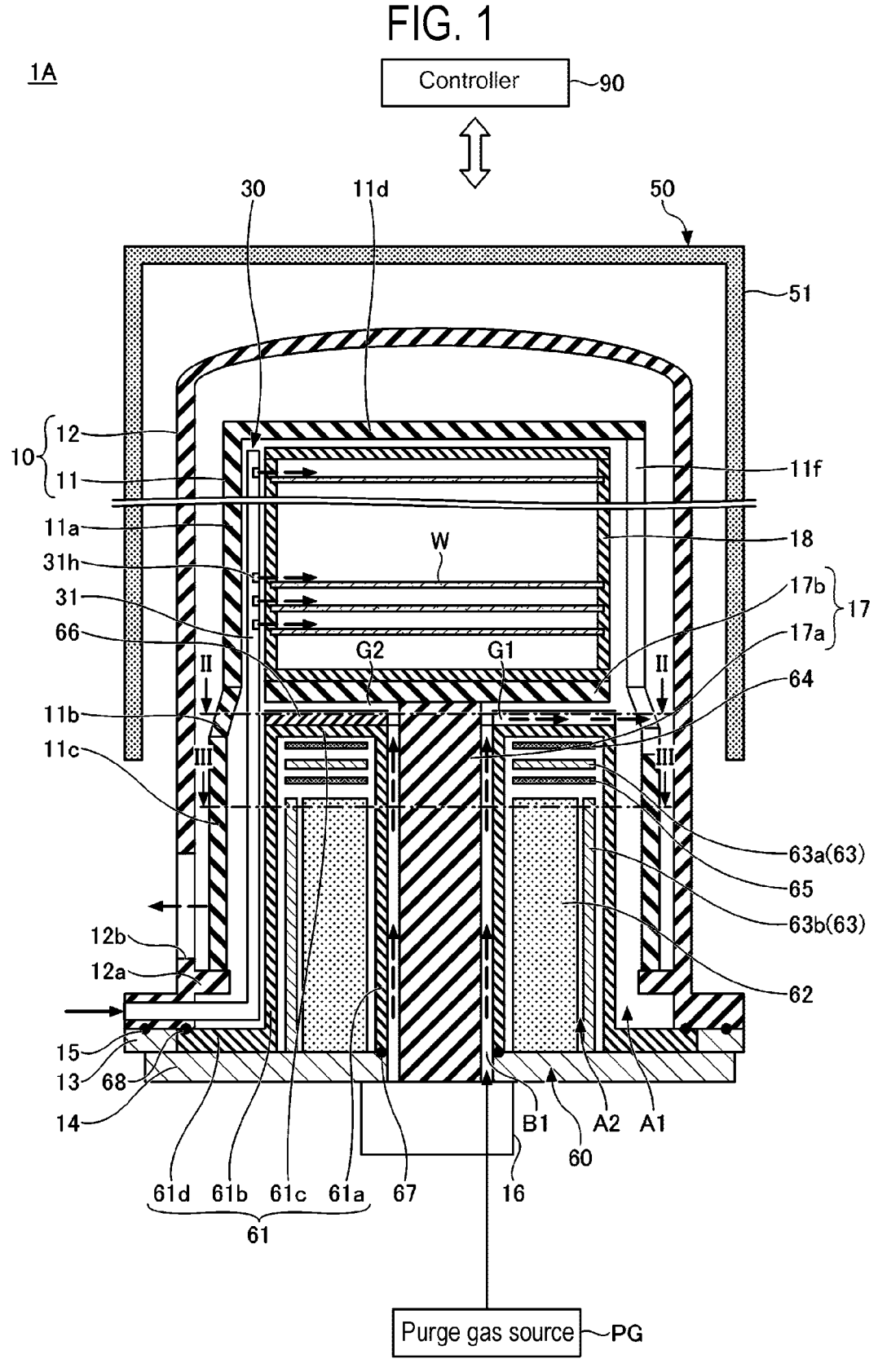
FIG. 1 is a schematic diagram showing a heat treatment apparatus according to a first embodiment.

Non-limiting exemplary embodiments of the present disclosure will now be described with reference to the accompanying drawings. Throughout the attached drawings, the same or corresponding members or parts are denoted by the same or corresponding reference numerals, and the overlapping descriptions thereof are omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 2:
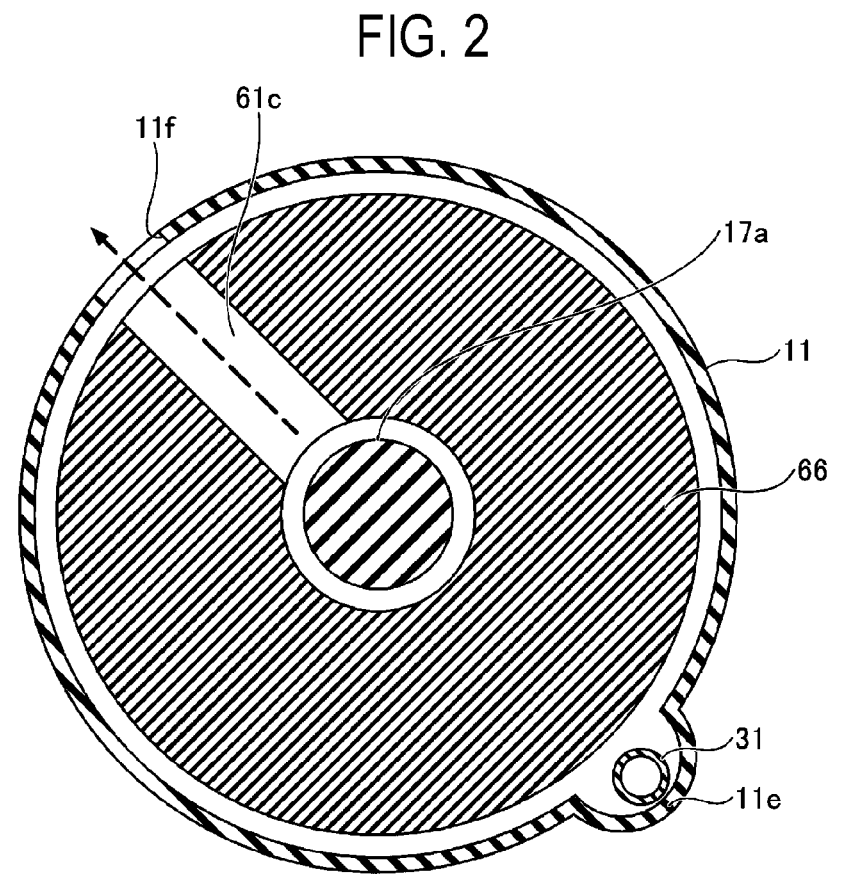
FIG. 2 is a cross-sectional view taken along line II-II in FIG. 1.
Figure 3:
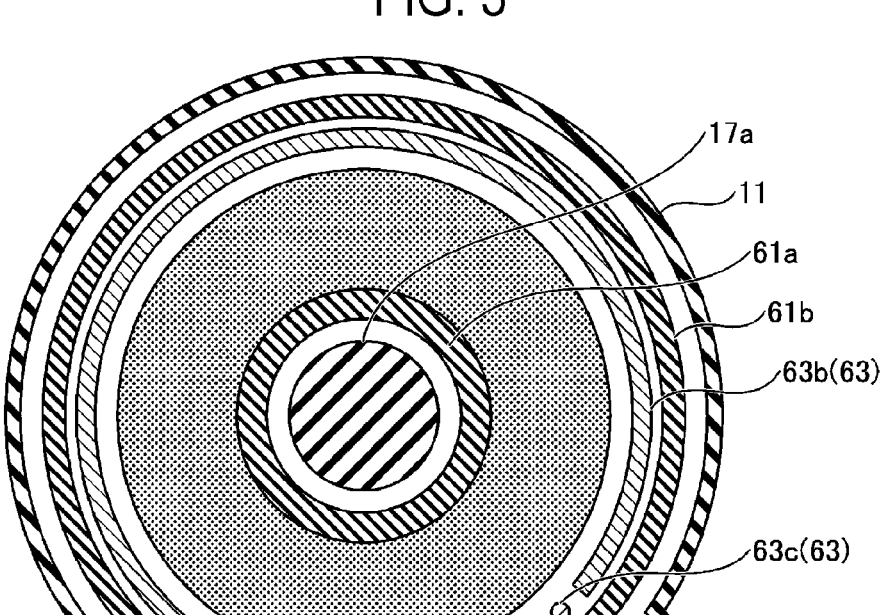
FIG. 3 is a cross-sectional view taken along line in FIG. 1.
Figure 4:
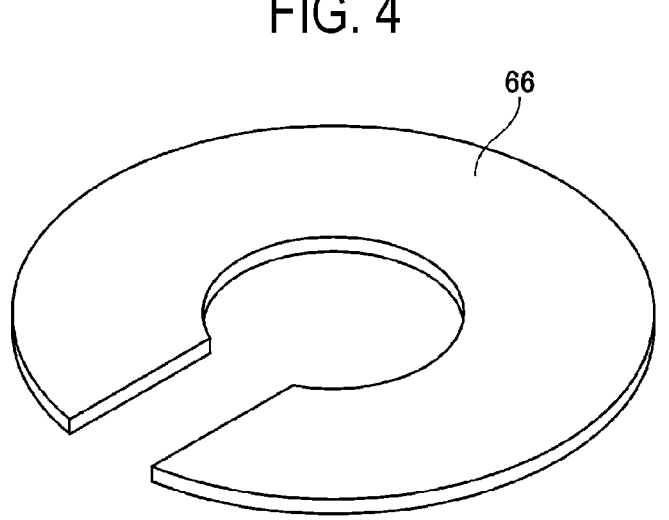
FIG. 4 is a perspective view of a plate viewed obliquely from above.

A heat treatment apparatus according to a first embodiment will be described with reference to FIGS. 1 to 4. FIG. 1 is a schematic diagram showing a heat treatment apparatus according to a first embodiment. FIG. 2 is a cross-sectional view taken along line II-II in FIG. 1. FIG. 3 is a cross-sectional view taken along line in FIG. 1. FIG. 4 is a perspective view of a plate viewed obliquely from above.

The heat treatment apparatus 1A according to the first embodiment is a batch type apparatus that performs a heat treatment on a plurality of substrates W at once. The substrate W is, for example, a semiconductor wafer. The heat treatment is, for example, a film forming process. The heat treatment apparatus 1A includes a processing container 10, a gas supplier 30, a heater 50, a heat insulator 60 and a controller 90.

The interior of the processing container 10 may be depressurized. The processing container 10 accommodates substrates W therein. The processing container 10 includes an inner tube 11 and an outer tube 12.

The inner tube 11 has a roof in a cylindrical shape and a lower end opening. The outer tube 12 has a roof in a cylindrical shape and a lower end opening, and covers the inner tube 11. The inner tube 11 and the outer tube 12 are coaxially arranged to have a double tube structure. The inner tube 11 and the outer tube 12 are made of quartz, for example.

The inner tube 11 includes a first cylindrical portion 11a, a larger diameter portion 11b, a second cylindrical portion 11c, and a top plate 11d. The first cylindrical portion 11a, the larger diameter portion 11b, and the second cylindrical portion 11c are provided in the named order from the upper side toward the lower side. The first cylindrical portion 11a is provided to include a height region from above the upper end of the boat 18 to the lower end of the boat 18, which will be described later. The first cylindrical portion 11a has a first inner diameter. The larger diameter portion 11b is located below the first cylindrical portion 11a. The larger diameter portion 11b is enlarged in diameter from a first inner diameter to a second inner diameter from the top to the bottom. The second inner diameter is larger than the first inner diameter. The second cylindrical portion 11c is located below the larger diameter portion 11b. The second cylindrical portion 11c has a second inner diameter. The top plate 11d closes the upper end opening of the first cylindrical portion 11a.

The inner tube 11 has a convex portion 11e formed by causing a portion of the sidewall to protrude toward the outside. The convex portion 11e is formed to extend along the longitudinal direction (vertical direction) of the inner tube 11. The convex portion 11e forms therein an accommodation portion for accommodating an injector 31, which will be described later. A rectangular exhaust port 11f extending in the vertical direction is formed on the opposite sidewall of the inner tube 11 so as to face the convex portion 11e. Specifically, the exhaust port 11f is formed to extend from the first cylindrical portion 11a of the inner tube 11 to the vicinity of the upper end of the second cylindrical portion 11c. The processing gas in the processing container 10 is exhausted through the exhaust port 11f.

The lower end of the outer tube 12 is supported by an annular flange member 13 made of stainless steel, for example, and is air-tightly attached via a sealing member 15 such as an O-ring. An annular plate-shaped support portion 12a is provided on the lower inner wall of the outer tube 12. The support portion 12a supports the lower end of the inner tube 11. A gas outlet 12b is provided on the sidewall of the outer tube 12 and above the support portion 12a. An exhaust passage (not shown) is connected to the gas outlet 12b. A pressure regulation valve and a vacuum pump (both of which are not shown) are sequentially installed in the exhaust passage. A lid 14 is hermetically attached to the lower end opening of the outer tube 12 via a sealing member 68 such as an O-ring. The lid 14 air-tightly closes the lower end opening of the processing container 10, i.e., the opening of the outer tube 12. The lid 14 is made of metal such as stainless steel.

A rotation mechanism 16 is provided at the central portion of the lid 14. The rotation mechanism 16 includes, for example, a magnetic fluid seal. An arm (not shown) of an elevating mechanism including a boat elevator is connected to the lower portion of the rotation mechanism 16. The rotation mechanism 16 is moved up and down by raising and lowering the arm. A support 17 is connected to the upper portion of the rotation mechanism 16. The support 17 is rotatable with respect to the lid 14. The support 17 is made of quartz, for example. The support 17 includes a shaft portion 17a and a placement portion 17b. The lower portion of the shaft portion 17a is connected to the rotation mechanism 16. The placement portion 17b is located above the shaft portion 17a. The placement portion 17b has a disc shape with a larger diameter than the shaft portion 17a when viewed from above. The placement portion 17b supports a boat 18. The boat 18 holds a plurality of (e.g., 25 to 200) substrates W arranged horizontally in multiple stages in the vertical direction. The boat 18 is made of quartz or silicon carbide, for example. The boat 18 is moved up and down together with the lid 14, the rotation mechanism 16 and the support 17 by raising and lowering the arm. Thus, the boat 18 is inserted into and removed from the processing container 10.

The gas supplier 30 includes an injector 31. The injector 31 extends linearly along the arrangement direction (vertical direction) of the plurality of substrates W in the vicinity of the inner surface of the inner tube 11, bends in an L-shape below the inner tube 11, and extends to the outside of the inner tube 11. The injector 31 is made of quartz, for example. A gas source (not shown) of a processing gas is connected to the end of the injector 31 outside the inner tube 11 in via a gas supply path (not shown). A plurality of discharge holes 31h is formed in the portion of the injector 31 located inside the inner pipe 11. The respective discharge holes 31h are formed at predetermined intervals along the extension direction of the injector 31. The processing gas of the gas source flows into the injector 31 from the gas supply path and is discharged into the inner tube 11 through the respective discharge holes 31h. The inner tube 11 has a reduced inner diameter in a height region where the boat 18 is positioned, and the exhaust port 11f is provided to face the injector 31. In this case, the processing gas discharged from the respective discharge holes 31h can be promoted to flow toward the substrates W. For example, the interval between the discharge holes 31h is set to be the same as the interval between the substrates W held in the boat 18. The position of each discharge hole 31h in the height direction is set, for example, at an intermediate position between the substrates W adjacent to each other in the vertical direction. In this case, each discharge hole 31h can efficiently supply the processing gas to the opposing surfaces between the adjacent substrates W.

The gas supplier 30 may mix a plurality of types of processing gases and discharge the mixed processing gas from one injector. In addition to the injector 31, the gas supplier 30 may further include an injector for discharging another processing gas.

The heater 50 includes a chamber heater 51. The chamber heater 51 surrounds the processing container 10 on the radially outer side of the processing container 10 and has a roofed cylindrical shape that covers the ceiling of the processing container 10. The chamber heater 51 heats each substrate W accommodated in the processing container 10 by heating the side periphery and the ceiling of the processing container 10.

The heat insulator 60 includes a partitioning member 61, a heat insulating material 62, a heater 63, a radiator 64, a reflector 65 and a plate 66.

The partitioning member 61 is installed on the lid 14. The partitioning member 61 is positioned inside the processing container 10 in a state in which the lower end opening of the processing container 10 is air-tightly closed by the lid 14. The partitioning member 61 is made of quartz, for example. The partitioning member 61 includes an inner wall portion 61a, an outer wall portion 61b, a top wall portion 61c, and a flange portion 61d.

The inner wall portion 61a is provided around the shaft portion 17a. The inner wall portion 61a has a cylindrical shape. The lower end of the inner wall portion 61a is placed on the lid 14 via a sealing member 67 such as an O-ring. A narrow space B1 is provided between the inner surface of the inner wall portion 61a and the outer surface of the shaft portion 17a. A purge gas is supplied to the narrow space B1 from a purge gas source PG. The purge gas is supplied from the bottom toward the top of the processing container 10. The purge gas suppresses the processing gas discharged into the inner tube 11 from flowing into the rotation mechanism 16. The purge gas is a nitrogen gas, for example.

The outer wall portion 61b is provided around the inner wall portion 61a. The outer wall portion 61b has a cylindrical shape. The outer wall portion 61b is provided coaxially with the inner wall portion 61a. The lower end of the outer wall portion 61b is placed on the lid 14.

The top wall portion 61c connects the upper end of the inner wall portion 61a and the upper end of the outer wall portion 61b, and closes the upper portion of the space between the inner wall portion 61*a* and the outer wall portion 61*b*. The top wall portion 61*c* has an annular plate shape. The top wall portion 61*c*, the lid 14, the inner wall portion 61*a* and the outer wall portion 61*b* form a second space A2 partitioned from a first space A1 inside the processing container 10. The first space A1 is switched between an air atmosphere and a vacuum atmosphere. The second space A2 is an environment outside the processing container 10. The second space A2 is maintained, for example, in an air atmosphere or an inert gas atmosphere. The inert gas is a nitrogen gas, for example. The top wall portion 61*c* faces the placement portion 17*b* across a gap.

The flange portion 61*d* extends outward from the lower portion of the outer wall portion 61*b*. A sealing member 68 such as an O-ring is provided between the upper surface of the outer edge of the flange portion 61*d* and the lower end of the outer tube 12.

The heat insulating material 62 is provided in the second space A2. The heat insulating material 62 is installed, for example, on the lid 14. The heat insulating material 62 suppresses heat radiation from the lower end opening of the processing container 10. The heat insulating material 62 has a structure in which a fibrous heat insulating material is molded into a cylindrical shape. However, the heat insulating material 62 is not limited to the fiber heat insulating material. For example, the heat insulating material 62 may have a structure in which heat insulating plates made of quartz, silicon carbide, or the like are stacked at intervals in the vertical direction.

The heater 63 includes a top plate heater 63*a*, an outer cylindrical heater 63*b*, and an injector heater 63*c*. The heater 63 may further include another heater.

The top plate heater 63*a* is provided between the top wall portion 61*c* and the heat insulating material 62. By providing the top plate heater 63*a*, the uniform heating length in the vertical direction in the processing container 10 is improved. The top plate heater 63*a* has, for example, an annular plate shape. The top plate heater 63*a* may be, for example, a carbon-based heater. In this case, the temperature rise/fall characteristic can be improved and the temperature recovery time can be shortened. Further, the top plate heater 63*a* may be a heater other than the carbon-based heater. Since the second space A2 is a space partitioned from the first space A1, an inexpensive heater such as a sheath heater or a Kanthal wire heater can be used. In this case, the cost can be greatly reduced as compared with the carbon-based heater.

The outer cylindrical heater 63*b* is provided between the outer wall portion 61*b* and the heat insulating material 62. The outer cylindrical heater 63*b* heats the outer wall portion 61*b*. As a result, it is possible to suppress adhesion of by-products to the surface of the outer wall portion 61*b*. The outer cylindrical heater 63*b* has, for example, a cylindrical shape and is installed on the lid 14. The outer cylindrical heater 63*b* may be, for example, a sheath heater. In this case, since far-infrared rays are emitted, the outer wall portion 61*b* made of quartz is easily heated.

The injector heater 63*c* is provided between the outer wall portion 61*b* and the heat insulating material 62. The injector heater 63*c* has a bar shape extending in the vertical direction. For example, the injector heater 63*c* is provided at the same angular position as the injector 31 in the circumferential direction of the processing container 10. In this case, since the processing gas can be heated before being discharged from each discharge hole 31*h*, it is possible to suppress a decrease in the temperature of the processing gas discharged toward the substrates W held in the lower portion of the boat 18.

The radiator 64 is provided between the top wall portion 61*c* and the top plate heater 63*a*. The radiator 64 absorbs heat from the substrate W before radiating it downward, and radiates the heat toward the substrate W. Thus, the substrate W can be efficiently heated. The radiator 64 is made of alumina or silicon carbide, for example. In this case, since the radiator 64 has a high radiation rate, the heating efficiency of the substrate W is enhanced.

The reflector 65 is provided between the heat insulating material 62 and the top plate heater 63*a*. The reflector 65 reflects unnecessary heat toward the lower side of the top plate heater 63*a* to improve the heating performance of the top plate heater 63*a*. The reflector 65 is made of, for example, a gold-plated plate. Since the gold-plated plate has a high reflectance, it can efficiently reflect unnecessary heat toward the lower side of the top plate heater 63*a*. Since the gold-plated plate is chemically stable, it is easy to suppress deterioration thereof.

The plate 66 is installed on the top wall portion 61*c*. The plate 66 is made of quartz, for example. The plate 66 has a C-shape that opens toward the exhaust port 11*f* in a plan view from the axial direction of the processing container 10. Thus, a first gap G1 including at least the angular position where the exhaust port 1 if is provided, and a second gap G2 provided at the angular position excluding the first gap G1 are formed between the lower surface of the support 17 and the upper surface of the partitioning member 61 in the circumferential direction of the processing container 10. The first gap G1 is wider than the second gap G2. In this case, the purge gas supplied to the narrow space B1 is guided to the exhaust port 11*f* through the first gap G1. Therefore, it is possible to prevent the purge gas supplied to the narrow space B1 from flowing into the boat 18, and to reduce the influence on the heat treatment of the substrates W held in the boat 18. As a result, the uniformity of the heat treatment can be enhanced. It is preferable that the exhaust port 11*f* be provided so as to include at least the same height position as the first gap G1. In this case, the purge gas that has passed through the first gap G1 is easily guided to the exhaust port 11*f*. Further, the exhaust port 11*f* is formed so as to extend from the first cylindrical portion 11*a* of the inner tube 11 to the vicinity of the upper end of the second cylindrical portion 11*c*. Since the second inner diameter is larger than the first inner diameter at the lower portion of the inner tube 11 due to the larger diameter portion 11*b*, the purge gas that has passed through the first gap G1 and the second gap G2 is less likely to flow into the boat. That is, the distance between the inner surface of the inner tube 11 and the outer peripheral surface of the placement portion 17*b* is sufficiently smaller than the distance between the inner surface of the inner tube 11 and the outer wall portion 61*b* of the partitioning member 61. Therefore, the purge gas flows into the space between the inner tube 11 and the outer wall portion 61*b* of the partitioning member 61, and is guided to the exhaust port 11*f* formed in the larger diameter portion 11*b* and the second cylindrical portion 11*c*. As a result, it is possible to suppress the purge gas from flowing into the boat 18, and to reduce the influence on the heat treatment of the substrates W held in the boat 18. In the first embodiment, there has been described the example in which the exhaust port 11*f* extends from the first cylindrical portion 11*a* of the inner tube 11 to the vicinity of the upper end of the second cylindrical portion 11*c*. However, the present disclosure is not limited thereto. The exhaust port 11*f* may be configured to extend from the first cylindrical portion 11*a* of the inner tube 11 to the middle of the larger diameter portion 11*b*. As long as the exhaust port 11*f* is formed to extend to at least the middle of the larger diameter portion 11*b*, the same effect can be obtained.

The controller 90 controls, for example, the operations of the respective parts of the heat treatment apparatus 1A. The controller 90 may be, for example, a computer. Further, a computer program for operating the respective parts of the heat treatment apparatus 1A is stored in a storage medium. The storage medium may be, for example, a flexible disk, a compact disk, a hard disk, a flash memory, a DVD, or the like.

As described above, according to the heat treatment apparatus 1A of the first embodiment, the heat insulating material 62 is provided in the second space A2 partitioned from the first space A1 by the partitioning member 61. In this case, since the surface area of the first space A1 is small, it is possible to reduce the consumption of the processing gas. On the other hand, if the heat insulating material 62 is provided in the first space A, the processing gas flows into the heat insulating material 62, eventually increasing the consumption of the processing gas.

Further, according to the heat treatment apparatus 1A of the first embodiment, the heat insulating material 62 is provided in the second space A2 partitioned from the first space A1 by the partitioning member 61. In this case, since the volume of the first space A1 is reduced, it is possible to shorten the time required to switch the first space A1 between the air atmosphere and the vacuum atmosphere. On the other hand, if the heat insulating material 62 is provided in the first space A1, the volume of the first space A1 is increased by at least the volume of the heat insulating material 62. Therefore, it takes a long time to switch the first space A1 between the air atmosphere and the vacuum atmosphere.

Further, according to the heat treatment apparatus 1A of the first embodiment, the heat insulating material 62 is provided in the second space A2 partitioned from the first space A1 by the partitioning member 61. In this case, since the surface area of the first space A1 is small, the adhesion of by-products generated from the processing gas can be reduced, and the generation of particles can be suppressed. Further, the top plate heater 63*a* and the outer cylindrical heater 63*b* are provided in the second space A2. In this case, the surface of the partitioning member 61 can be heated by the top plate heater 63*a* and the outer cylindrical heater 63*b*. Therefore, the adhesion of by-products to the surface of the partitioning member 61 can be easily suppressed. On the other hand, if the heat insulating material 62 is provided in the first space A1, the surface area of the first space A1 becomes large. Therefore, the adhesion of by-products generated from the processing gas increases. Further, if the top plate heater 63*a* and the outer cylindrical heater 63*b* are not provided, the temperature of the heat insulating material 62 cannot be controlled locally. Therefore, by-products tend to adhere to the heat insulating material 62.

Further, according to the heat treatment apparatus 1A of the first embodiment, the heat insulating material 62 is provided in the second space A2 partitioned from the first space A1 by the partitioning member 61. In this case, the by-products may adhere to the surface of the partitioning member 61, but the by-products do not adhere to the heat insulating material 62. Therefore, the time required for removing the by-products by cleaning can be shortened. On the other hand, if the heat insulating material 62 is provided in the first space A1, the by-products adhere to the heat insulating material 62. Therefore, it takes a long time to remove the by-products by cleaning.

Further, according to the heat treatment apparatus 1A of the first embodiment, the plate 66 is installed on the top wall portion 61*c* and has a C shape that opens toward the exhaust port 11*f* in a plan view from the axial direction of the processing container 10. Thus, the first gap G1 including at least the angular position where the exhaust port 11*f* is provided, and the second gap G2 provided at the angular position excluding the first gap G1 are formed between the lower surface of the support 17 and the upper surface of the partitioning member 61 in the circumferential direction of the processing container 10. The first gap G1 is wider than the second gap G2. In this case, the purge gas supplied to the narrow space B1 is guided to the exhaust port 11*f* through the first gap G1. Therefore, it is possible to prevent the purge gas supplied to the narrow space B1 from flowing into the boat 18, and to reduce the influence on the heat treatment of the substrates W held in the boat 18. As a result, the uniformity of the heat treatment can be enhanced.

Second Embodiment

Figure 5:
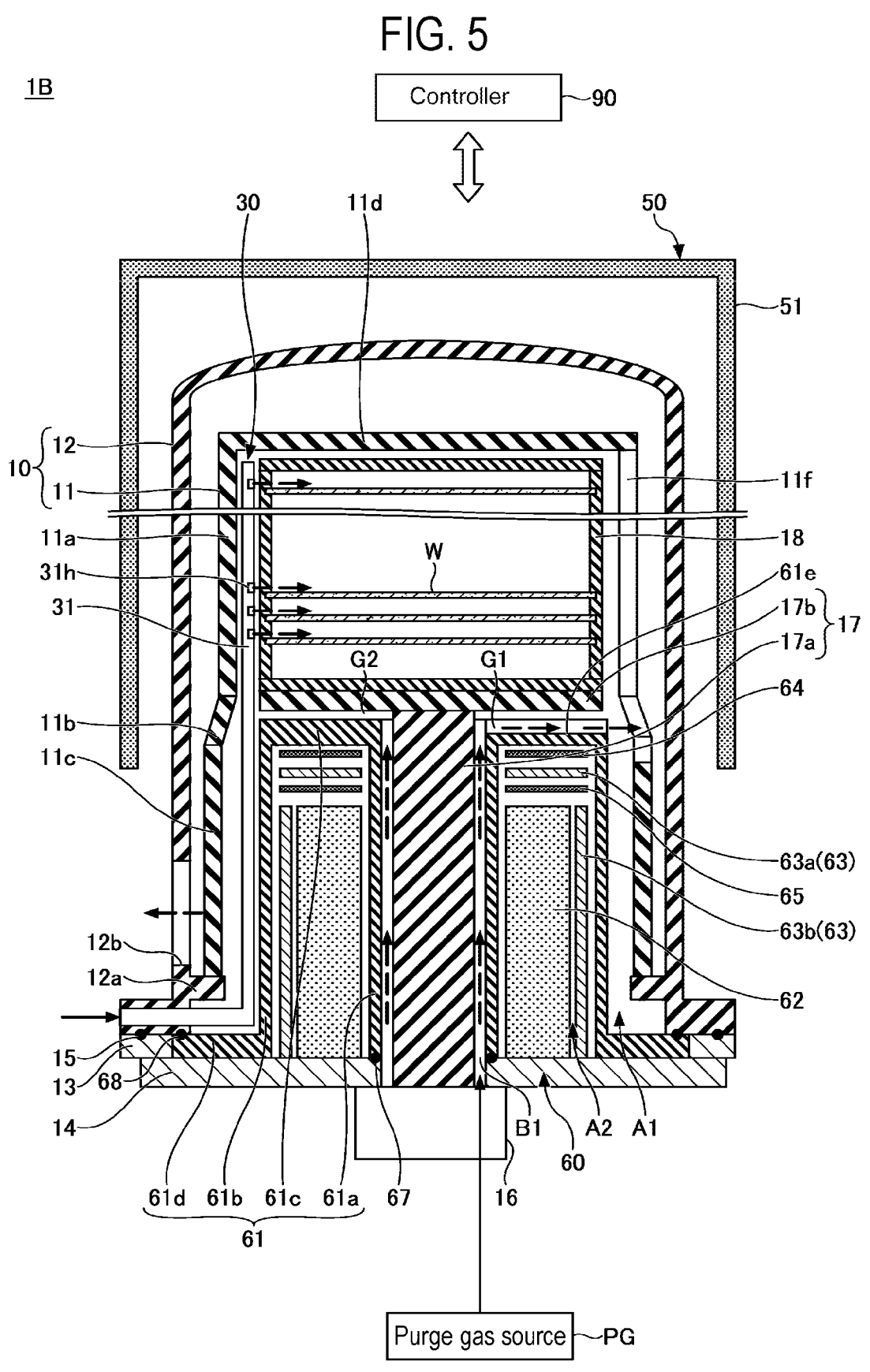
FIG. 5 is a schematic diagram showing a heat treatment apparatus according to a second embodiment.
Figure 6:
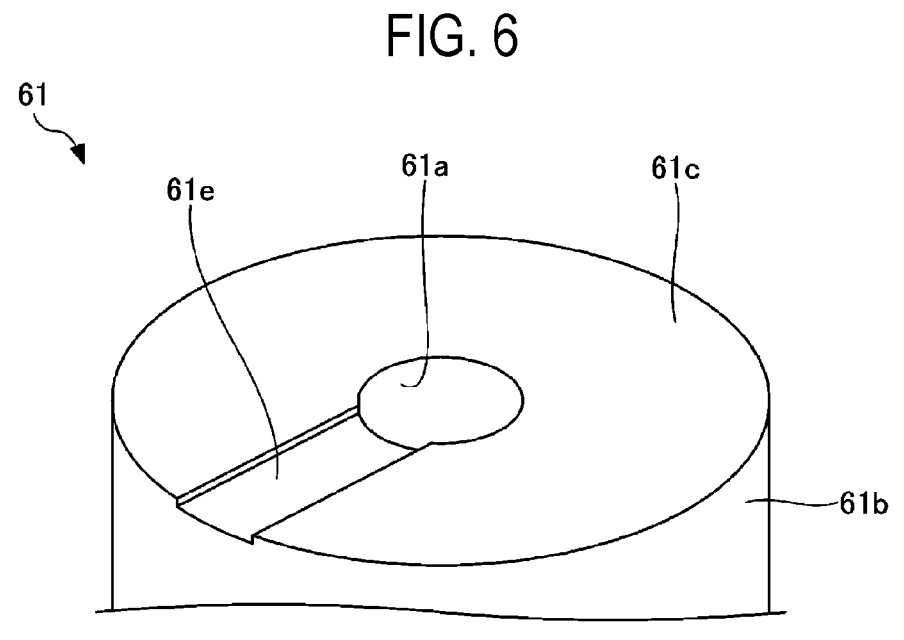

A heat treatment apparatus according to a second embodiment will be described with reference to FIGS. 5 and 6. FIG. 5 is a schematic diagram showing a heat treatment apparatus according to a second embodiment. FIG. 6 is a perspective view of a partitioning member viewed obliquely from above.

A heat treatment apparatus 1B according to the second embodiment differs from the heat treatment apparatus 1A according to the first embodiment in that the heat treatment apparatus 1B does not include the plate 66, and the first gap G1 is formed by a groove 61*e* formed on the top wall portion 61*c* of the partitioning member 61. Other configurations may be the same as those of the heat treatment apparatus 1A. In the following, the points different from the heat treatment apparatus 1A will be mainly described.

The top wall portion 61*c* has a groove 61*e* formed on its upper surface to extend from the radially inner side to the radially outer side. The groove 61*e* is provided in the circumferential direction of the processing container 10 so as to include at least an angular position where the exhaust port 1 if is provided. Thus, a first gap G1 including at least an angular position where the exhaust port 1 if is provided, and a second gap G2 provided at an angular position excluding the first gap G1 are formed between the lower surface of the support 17 and the upper surface of the partitioning member 61 in the circumferential direction of the processing container 10. The first gap G1 is wider than the second gap G2. In this case, the purge gas supplied to the narrow space B1 is guided to the exhaust port 11*f* through the first gap G1. Therefore, it is possible to prevent the purge gas supplied to the narrow space B1 from flowing into the boat 18, and to reduce the influence on the heat treatment of the substrates W held in the boat 18. As a result, the uniformity of the heat treatment can be enhanced.

As described above, according to the heat treatment apparatus 1B of the second embodiment, it is possible to achieve the same effects as those of the heat treatment apparatus 1A of the first embodiment.

Third Embodiment

Figure 7:
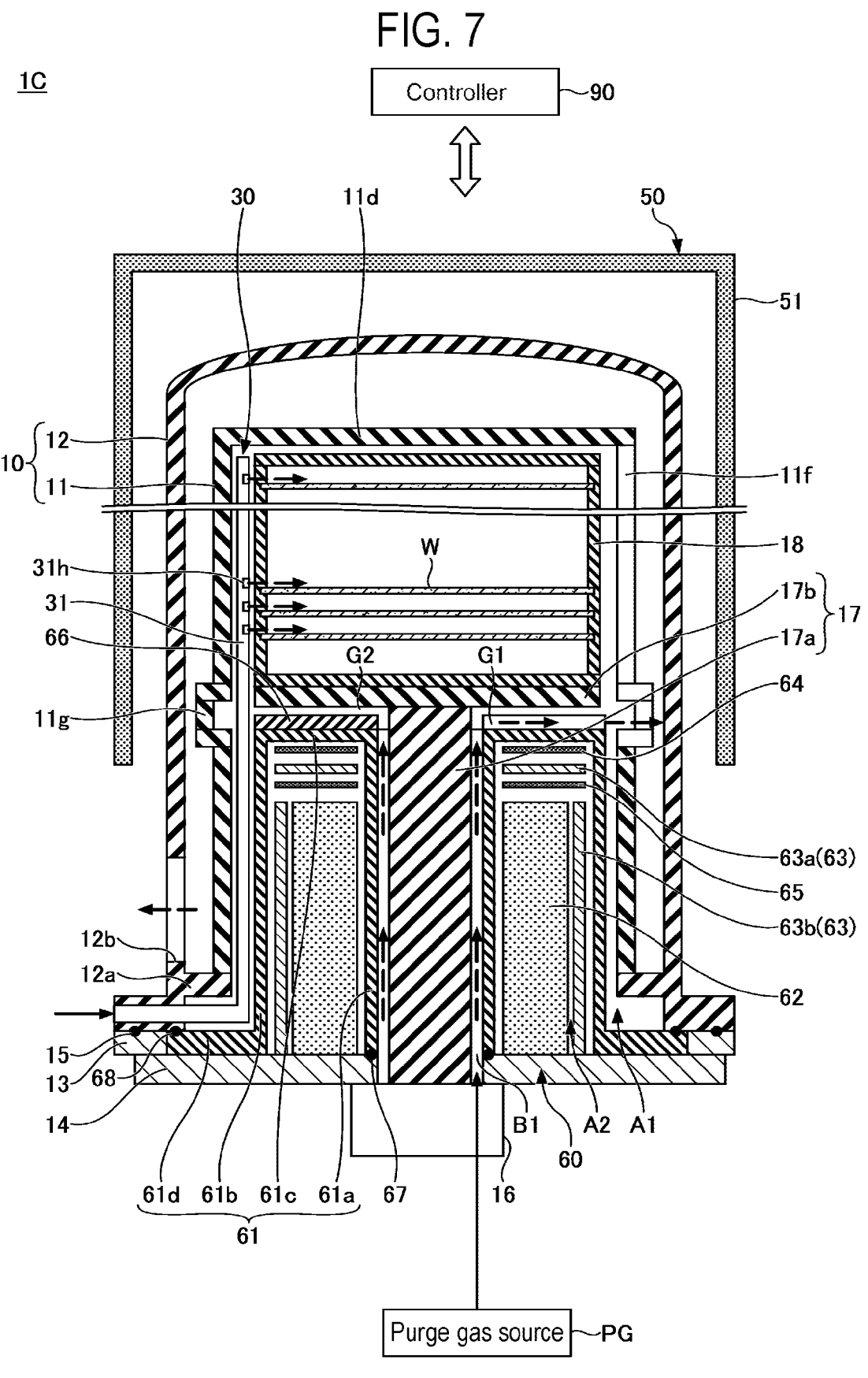
FIG. 7 is a schematic diagram showing a heat treatment apparatus according to a third embodiment.
Figure 8:
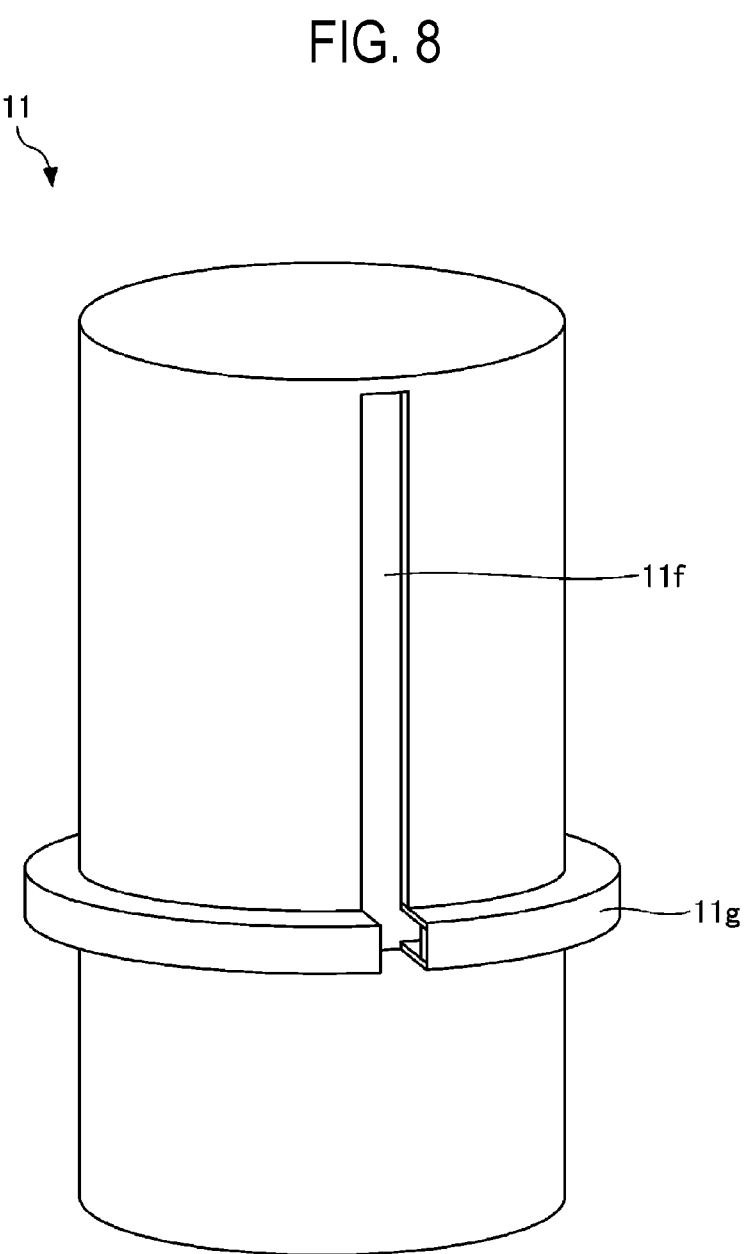
FIG. 8 is a perspective view showing an overhang portion.

A heat treatment apparatus according to a third embodiment will be described with reference to FIGS. 7 and 8. FIG. 7 is a schematic diagram showing a heat treatment apparatus according to a third embodiment. FIG. 8 is a perspective view showing an overhang portion.

A heat treatment apparatus 1C according to the third embodiment differs from the heat treatment apparatus 1A according to the first embodiment in that the heat treatment apparatus 1C includes an overhang portion 11g which is provided to include the same height position as the first gap G1 and which overhangs radially outward from the sidewall. Other configurations may be the same as those of the heat treatment apparatus 1A. In the following, the points different from the heat treatment apparatus 1A will be mainly described.

The inner tube 11 has an overhang portion 11g overhanging radially outward from the sidewall. The overhang portion 11g is provided to include the same height position as the first gap G1. Due to the provision of the overhang portion 11g, even when the purge gas supplied to the narrow space B1 passes through the second gap G2, the purge gas flows through the buffer space formed inside the overhang portion 11g in the circumferential direction and is guided to the exhaust port 11f. The exhaust port 11f is provided to include the overhang portion 11g. For example, the exhaust port 11f is provided on the overhang portion 11g and the sidewall of the inner tube 11 above the overhang portion 11g.

As described above, according to the heat treatment apparatus 1C of the third embodiment, it is possible to achieve the same effects as those of the heat treatment apparatus 1A of the first embodiment.

Fourth Embodiment

Figure 9:
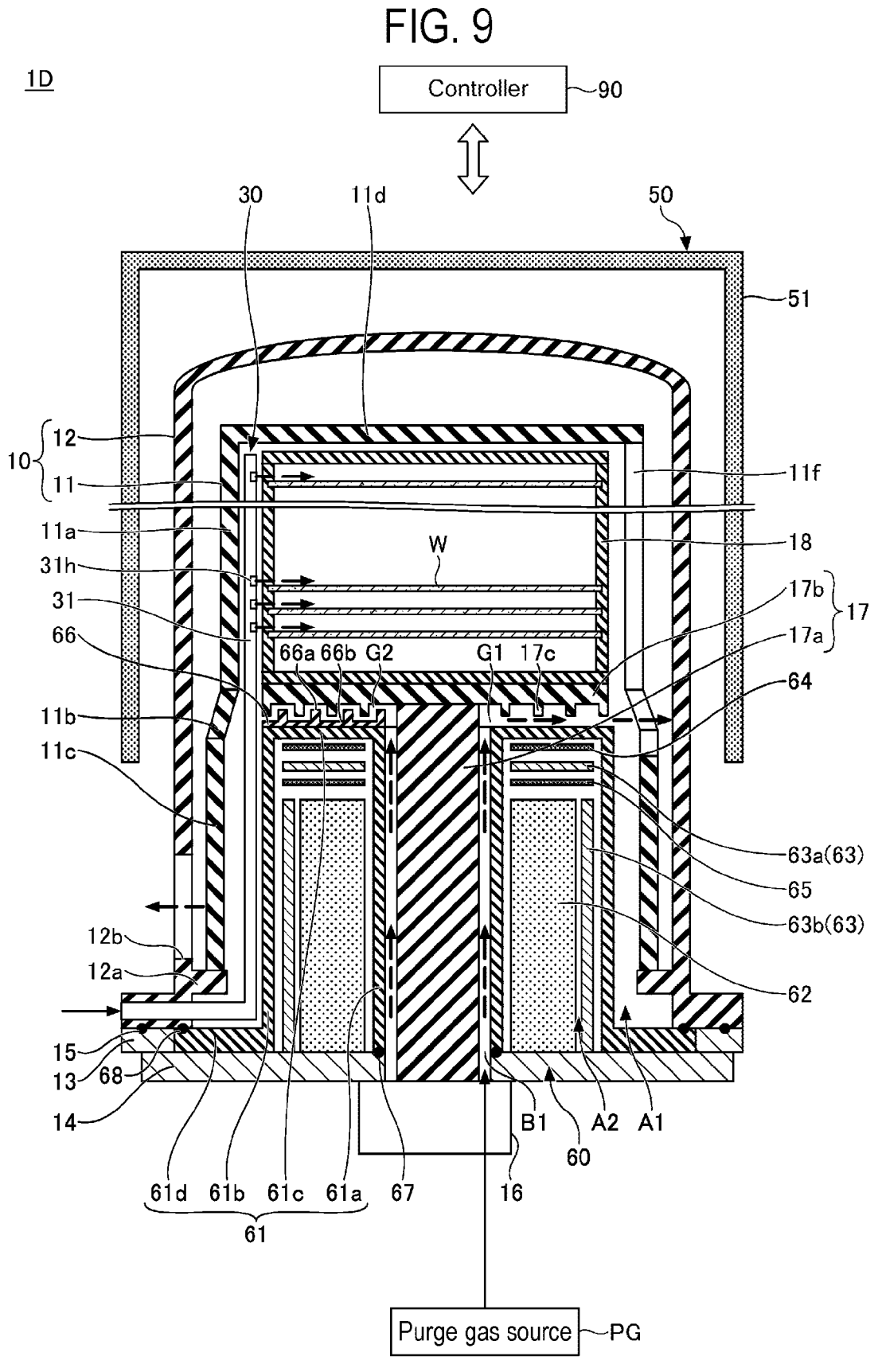
FIG. 9 is a schematic diagram showing a heat treatment apparatus according to a fourth embodiment.
Figure 10:
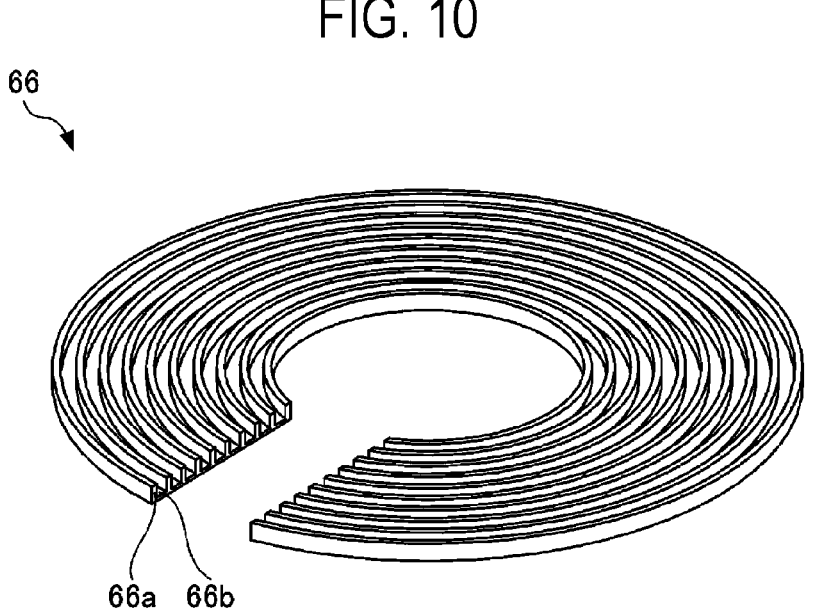
FIG. 10 is a perspective view of a plate as viewed obliquely from above.

A heat treatment apparatus according to a fourth embodiment will be described with reference to FIGS. 9 and 10. FIG. 9 is a schematic diagram showing a heat treatment apparatus according to a fourth embodiment. FIG. 10 is a perspective view of a plate viewed obliquely from above.

A heat treatment apparatus 1D according to the fourth embodiment differs from the heat treatment apparatus 1A according to the first embodiment in that a labyrinth structure is provided in the second gap G2. Other configurations may be the same as those of the heat treatment apparatus 1A. In the following, the points different from the heat treatment apparatus 1A will be mainly described.

The plate 66 is installed on the top wall portion 61c. The plate 66 is made of quartz, for example. The plate 66 has a C-shape that opens toward the exhaust port 11f in a plan view from the axial direction of the processing container 10. Convex portions 66a and concave portions 66b are alternately provided on the upper surface of the plate 66 along the radial direction. The convex portions 66a and the concave portions 66b are provided concentrically.

Convex portions 17c are provided on the lower surface of the placement portion 17b at positions facing the concave portions 66b. The convex portions 17c are provided, for example, over the entire circumferential direction. The convex portions 17c may be provided only at position where the plate 66 is provided in the circumferential direction.

In the heat treatment apparatus 1D, a labyrinth structure is formed in the second gap G2 by the convex portions 66a and the concave portions 66b provided on the upper surface of the plate 66 and the convex portion 17c provided on the lower surface of the placement portion 17b. On the other hand, no labyrinth structure is formed in the first gap G1. In this case, the purge gas supplied to the narrow space B1 is guided to the exhaust port 11f through the first gap G1. However, the purge gas supplied to the narrow space B1 is difficult to pass through the second gap G2. Therefore, it is possible to prevent the purge gas supplied to the narrow space B1 from flowing into the boat 18, and to reduce the influence on the heat treatment of the substrates W held in the boat 18. As a result, the uniformity of the heat treatment can be enhanced. In addition, the formation of the labyrinth structure can suppress back diffusion of the processing gas in the processing container 10 into the narrow space B1. As a result, a film is less likely to be formed on the surfaces of the shaft portion 17a and the inner wall portion 61a by the processing gas, which makes it possible to suppress adhesion of by-products.

As described above, according to the heat treatment apparatus 1D of the fourth embodiment, it is possible to achieve the same effects as those of the heat treatment apparatus 1A of the first embodiment.

It should be noted that the embodiments disclosed herein are exemplary in all respects and not limitative. The above-described embodiments may be omitted, substituted or modified in various ways without departing from the scope and spirit of the appended claims.

According to the present disclosure in some embodiments, it is possible to enhance the uniformity of a heat treatment.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus, comprising:
   a processing container having a roof in a cylindrical shape and a lower end opening, and in which a first space is formed;
   a lid configured to close the lower end opening;
   a support provided to pass through the lid and including a shaft portion and a placement portion located above the shaft portion;
   a boat installed on the placement portion and configured to hold a plurality of substrates arranged in multiple stages in a vertical direction;
   a partitioning member provided around the shaft portion with a gap left from a lower surface of the placement portion and configured to form a second space partitioned from the first space; and
   a heat insulating material provided in the second space,
   wherein an exhaust port is provided in a portion of a sidewall of the processing container,
   in a circumferential direction of the processing container, the gap includes a first gap having at least an angular position where the exhaust port is provided, and a second gap provided at an angular position excluding the first gap, and
   the first gap is wider than the second gap.

2. The heat treatment apparatus of claim 1, wherein the exhaust port is provided to include at least the same height position as the first gap.

3. The heat treatment apparatus of claim 1, wherein the partitioning member includes an inner wall portion provided around the shaft portion, an outer wall portion provided coaxially with the inner wall portion around the inner wall portion, and a top wall portion configured to connect an upper end of the inner wall portion and an upper end of the outer wall portion and close an upper portion of a space between the inner wall portion and the outer wall portion, and the top wall portion has a groove formed on an upper surface of the top wall portion to extend from a radially inner side to a radially outer side and form the first gap.

4. The heat treatment apparatus of claim 1, wherein the partitioning member includes an inner wall portion provided around the shaft portion, an outer wall portion provided coaxially with the inner wall portion around the inner wall portion, and a top wall portion configured to connect an upper end of the inner wall portion and an upper end of the outer wall portion and close an upper portion of a space between the inner wall portion and the outer wall portion, the heat treatment apparatus further comprises a plate provided on the top wall portion, and the plate has a C shape that opens toward the exhaust port in a plan view from an axial direction of the processing container.

5. The heat treatment apparatus of claim 1, wherein the processing container includes a first cylindrical portion having a first inner diameter, a second cylindrical portion having a second inner diameter larger than the first inner diameter, and a larger diameter portion provided between the first cylindrical portion and the second cylindrical portion, the first cylindrical portion, the larger diameter portion, and the second cylindrical portion are provided sequentially from an upper side to a lower side of the processing container, and the larger diameter portion is provided to include a same height position as the first gap.

6. The heat treatment apparatus of claim 5, wherein the exhaust port is formed to extend from the first cylindrical portion to at least the larger diameter portion.

7. The heat treatment apparatus of claim 1, wherein the processing container includes an overhang portion overhanging radially outward from the sidewall, and the overhang portion is provided to include a same height position as the first gap.

8. The heat treatment apparatus of claim 3, further comprising:

a heater provided between the top wall portion and the heat insulating material in the second space.

9. The heat treatment apparatus of claim 4, further comprising:

a heater provided between the top wall portion and the heat insulating material in the second space.

10. The heat treatment apparatus of claim 1, further comprising:

an injector provided to extend along an arrangement direction of the plurality of substrates inside the processing container; and a heater provided inside the partitioning member and at an angular position where the injector is provided in a circumferential direction of the processing container, and provided to extend along the arrangement direction.

11. The heat treatment apparatus of claim 1, wherein a labyrinth structure is provided in the second gap.

12. The heat treatment apparatus of claim 1, further comprising:

a purge gas source configured to supply a purge gas between the shaft portion and the partitioning member.

13. The heat treatment apparatus of claim 1, further comprising:

a second processing container having a roofed cylindrical shape and configured to cover an outside of the processing container.

* * * * *